United States Patent [19]

Lee et al.

[11] Patent Number: 4,954,873

[45] Date of Patent: Sep. 4, 1990

[54] ELECTRICAL CONNECTOR FOR SURFACE MOUNTING

[75] Inventors: James Lee, Los Altos Hills; Richard Beck, Cupertino; Chune Lee, San Francisco; Edward Hu, Sunnyvale, all of Calif.

[73] Assignee: Digital Equipment Corporation, Maynard, Mass.

[21] Appl. No.: 147,779

[22] Filed: Jan. 25, 1988

Related U.S. Application Data

[62] Division of Ser. No. 757,600, Jul. 22, 1985, Pat. No. 4,729,166.

[51] Int. Cl.[5] .......... H01L 23/12; H01L 23/14

[52] U.S. Cl. .......... 357/72; 357/80

[58] Field of Search .......... 357/67, 80, 72, 74; 174/68.5; 428/201, 209, 210, 247, 256, 304.4, 199, 300, 316; 361/414, 386, 398

[56] References Cited

U.S. PATENT DOCUMENTS

| | | | |
|---|---|---|---|
| 3,574,022 | 4/1971 | Lampert | 156/88 |
| 3,862,790 | 1/1975 | Davies et al. | 339/17 LM |
| 3,982,320 | 9/1976 | Buchoff et al. | 29/630 R |
| 3,998,513 | 12/1976 | Kobayashi et al. | 339/59 M |
| 4,003,621 | 1/1977 | Lamp | 339/59 M |
| 4,118,092 | 10/1978 | Sado et al. | 339/59 M |
| 4,210,895 | 7/1980 | Sado et al. | 338/99 |
| 4,252,391 | 2/1981 | Sado | 339/60 R |
| 4,295,700 | 10/1981 | Sado | 339/61 M |
| 4,330,165 | 5/1982 | Sado | 339/59 M |
| 4,408,814 | 10/1983 | Takashi et al. | 339/59 M |
| 4,449,774 | 5/1984 | Takashi et al. | 339/59 M |
| 4,482,912 | 11/1984 | Chiba et al. | 357/67 |
| 4,520,562 | 6/1985 | Sado et al. | 29/878 |
| 4,640,866 | 2/1987 | Suzuki | 174/68.5 |
| 4,689,262 | 8/1987 | Bloom | 174/68.5 |
| 4,707,565 | 11/1987 | Kasai et al. | 174/68.5 |
| 4,754,546 | 7/1988 | Lee et al. | 29/877 |
| 4,778,950 | 10/1988 | Lee et al. | 174/356 |

FOREIGN PATENT DOCUMENTS

| | | |
|---|---|---|
| 77748 | 8/1976 | Australia . |
| 57-138791 | 8/1982 | Japan . |
| 60-207276 | 10/1985 | Japan . |
| 61-88407 | 5/1986 | Japan . |

*Primary Examiner*—Rolf Hille
*Assistant Examiner*—S. V. Clark
*Attorney, Agent, or Firm*—Nutter, McClennen & Fish

[57] ABSTRACT

An anisotropic elastomeric conductor is fabricated by stacking a plurality of first and second sheets, where the first sheets include a plurality of parallel electrically conductive fibers and the second sheets are composed of electrically insulating material. By introducing a curable elastomeric resin into the layered structure of sheets, and then curing the resin, a solid elastomeric block having a plurality of parallel electrically conductive fibers running its length is obtained. Individual elastomeric conductors suitable for interfacing between electronic components are obtained by slicing the block in a direction perpendicular to the conductors. The conductor slices so obtained are particularly suitable for interfacing between electronic devices having planar arrays of electrical contact pads.

11 Claims, 2 Drawing Sheets

ELECTRICAL CONNECTOR FOR SURFACE MOUNTING

This application is a division of co-pending application Ser. No. 757,600, filed July 22, 1985, now U.S. Pat. No. 4,729,166.

BACKGROUND OF THE INVENTION

1. Field of the Invention

The present invention relates generally to methods of fabricating for electrically connecting electronic devices. More particularly, the invention relates to an improved method for fabricating anisotropic electrically conductive materials which can provide an electrical interface between devices placed on either side thereof.

Over the past ten years, electrically conductive elastomers have found increasing use as interface connectors between electronic devices, serving as an alternative for traditional solder and socket connections. Elastomeric conductors can take a variety of forms, but generally must provide for anisotropic electrical conduction. Anisotropic conduction means that the electrical resistance measured in one direction through the material will differ from that measured in another direction. Generally, the elastomeric conductors of the prior art have been materials which provide for high resistance in at least one of the orthogonal directions of the material, while providing low resistance in the remaining one or two directions. In this way, a single piece or sheet of material can provide for multiple connections so long as the connector terminals on the devices to be connected are properly aligned.

2. Description of the Prior Art

The anisotropic elastomeric conductors of the prior art generally consist of an electrically conductive material dispersed or arranged in an electrically insulating material. In one form, alternate sheets of conductive and non-conductive materials are layered to form a block, and individual connector pieces can be cut from the block in a direction perpendicular to the interface of the layers. Connector pieces embodying such layered connectors have been sold under the trade name "Zebra" by Tecknit, Cranford, N.J., and the trade name "Stax" by PCK Elastomerics, Inc., Hatboro, Pa. Such connectors are discussed generally in Buchoff, "Surface Mounting of Components with Elastomeric Connectors," Electri-Onics, June, 1983; Buchoff, "Elastomeric Connections for Test & Burn-In," Microelectronics Manufacturing and Testing, October, 1980; Anon., "Conductive Elastomeric Connectors Offer New Packaging Design Potential for Single Contacts or Complete Connection Systems," Insulation/Circuits, February, 1975; and Anon., "Conductive Elastomers Make Bid to Take Over Interconnections," Product Engineering, December 1974. While useful under a number of circumstances, such layered anisotropic elastomeric conductors provide electrical conductivity in two orthogonal directions, providing insulation only in the third orthogonal direction. Thus, the layered anisotropic elastomeric conductors are unsuitable for providing surface interface connections where a two-dimensional array of connector terminals on one surface is to be connected to a similar two-dimensional array of connectors on a second surface. Such a situation requires anisotropic elastomeric conductor which provides for conductivity in one direction only.

At least two manufacturers provide anisotropic elastomeric conductors which allow for conduction in one direction only. Tecknit, Cranford, N.J., manufactures a line of connectors under the trade name "Conmet." The Conmet connectors comprise elastomeric elements having two parallel rows of electrically conductive wires embedded therein. The wires are all parallel, and electrical connections may be made by sandwiching the connector between two surfaces so that good contact is established. The Conmet connector is for connecting circuit boards together, as well as connecting chip carriers and the like to printed circuit boards. The matrix is silicon rubber.

A second anisotropic elastomeric conductor which conducts in one direction only is manufactured by Shin-Etsu Polymer Company, Ltd., Japan, and described in U.S. Pat. Nos. 4,252,391; 4,252,990; 4,210,895; and 4,199,637. Referring in particular to U.S. Pat. No. 4,252,391, a pressure-sensitive electroconductive composite sheet is prepared by dispersing a plurality of electrically conductive fibers into an elastomeric matrix, such as silicone rubber. The combination of the rubber matrix and the conductive fibers are mixed under sheer conditions which break the fibers into lengths generally between 20 to 80% of the thickness of the sheet which is to be prepared. The fibers are then aligned parallel to one another by subjecting the mixture to a sheer deformation event, such as pumping or extruding. The composite mixture is then hardened, and sheets prepared by slicing from the hardened structure. The electrically conductive fibers do not extend the entire thickness of the resulting sheets, and electrical contact is made through the sheet only by applying pressure.

Although useful, the anisotropic elastomeric conductors of the prior art are generally difficult and expensive to manufacture. Particularly in the case of the elastomeric conductors having a plurality of conductive fibers, it is difficult to control the density of fibers at a particular location in the matrix, which problem is exacerbated when the density of the conductive fibers is very high.

For these reasons, it would be desirable to provide alternate methods for fabricating anisotropic elastomeric conductors which provide for conductivity in one direction only. In particular, it would be desirable to provide a method for preparing such elastomeric conductors having individual conductive fibers present in an elastomeric matrix in a precisely controlled uniform pattern.

SUMMARY OF THE INVENTION

A novel anisotropic elastomeric conductor is provided which is easy to manufacture and can be tailored to a wide range of specifications. The conductor comprises an elastomeric matrix having a plurality of electrically conductive fibers uniformly dispersed throughout. The conductor may be in the form of a block or a relatively thin slice, and the electrically conductive fibers extend across the conductor so that they terminate on opposite faces of the conductor. In this way, the anisotropic elastomeric conductor is particularly suited for interfacing between electronic components, particularly components having a plurality of conductor terminals arranged in a two-dimensional or planar array. The anisotropic elastomeric conductor may also find use as an interface between a heat-generating device, such as an electronic circuit device, and a heat sink. When acting as either an electrically conductive interface or a thermally conductive interface, the elastomeric material has the advantage that it can conform closely to the contours of both surfaces of the devices which are being coupled.

The anisotropic elastomeric conductors of the present invention are fabricated from first and second sheet materials, where the first sheet material includes a plurality of electrically-conductive fibers positioned to lie parallel to one another and electrically isolated from one another. In the exemplary embodiment, the first sheet comprises a wire cloth having metal fibers running in one direction and loosely woven with insulating fibers running in the transverse direction. The second sheet consists of an electrically-insulating fibers loosely woven in both directions. The first and second sheets are stacked on top of one another, typically in an alternating pattern, so that the secondary sheets provide insulation for the electrically-conductive fibers in the adjacent first sheets. After stacking a desired number of the first and second sheets, the layered structure is perfused with a liquid, curable elastomeric resin, such as a silicone rubber resin, to fill the interstices remaining in the layered structure of the loosely woven first and second sheets. Typically, pressure will be applied by well known transfer molding techniques, and the elastomer cured, typically by the application cf heat. The resulting block structure will include the electrically-conductive fibers embedded in a solid matrix comprising two components, i.e., the insulating fibers and the elastomeric material.

For most applications, slices will be cut from the block to a thickness suitable for the desired interface application. Often it will be desirable to dissolve at least a portion of the fibrous material in the matrix in order to introduce voids in the elastomeric conductor to enhance the compressibility of the conductor.

DESCRIPTION OF THE PREFERRED EMBODIMENT

Figure 1:
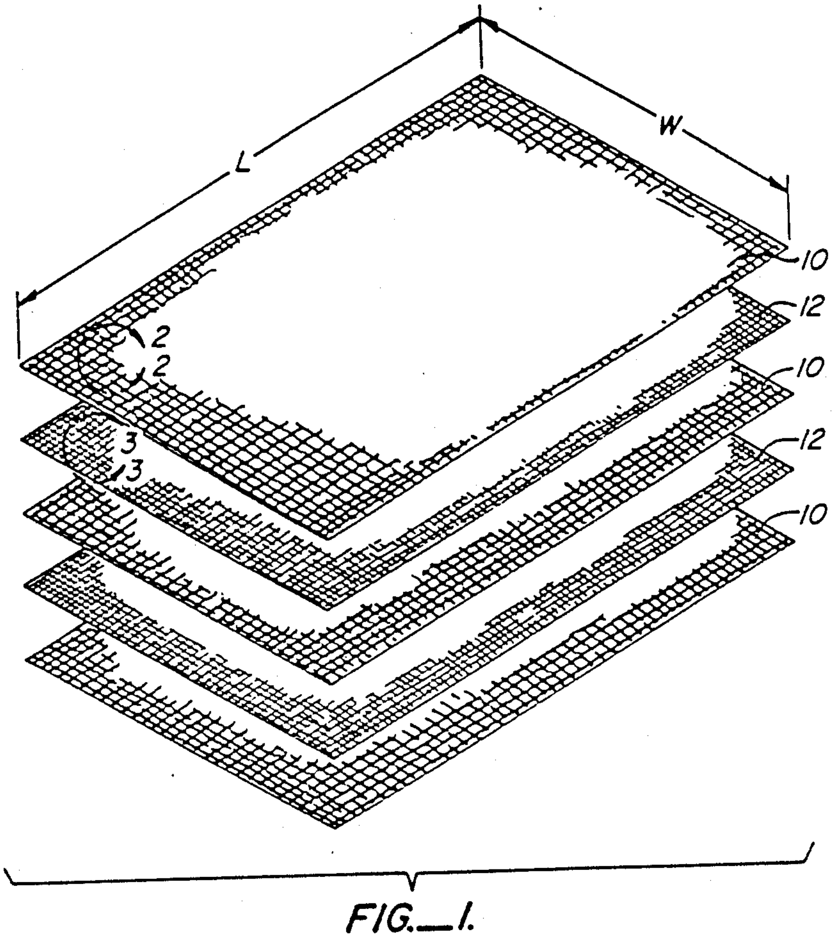
FIG. 1 illustrates the stacked first and second sheets of the present invention prior to compression and transfer molding.

According to the present invention, anisotropic elastomeric conductors are fabricated from first and second sheets of loosely woven fabric material. The first sheet materials are made up of both electrically-conductive and electrically insulating fibers, where the electrically-conductive fibers are oriented parallel to one another so that no two fibers contact each other at any point. The electrically insulating fibers run generally transversely to the electrically conductive fibers in order to complete the weave. In some cases, it may be desirable to include electrically insulating fibers running parallel to the electrically-conductive fibers, either in addition to or in place of the electrically-conductive fibers, in order to adjust the density of conductive fibers in the final product. The second sheet material will be a loosely woven fabric comprising only electrically insulating fibers. The second sheet material is thus able to act as an insulating layer between adjacent first layers having electrically-conductive fibers therein.

Suitable electrically-conductive fibers include virtually any fiber material having a bulk resistivity below about 50 $\mu\Omega$-cm, and preferably about 4 $\mu\Omega$-cm. Typically, the electrically-conductive fibers will be conductive metals, such as copper, aluminum, silver, and gold, and alloys thereof. Alternatively, suitable electrically conductive fibers can be prepared by modifying electrically insulating fibers, such as by introducing a conductivity-imparting agent such as metal particles to a natural or synthetic polymer. The preferred electrically-conductive fibers are copper, aluminum, silver, gold, and alloys thereof, particularly copper wire.

The electrically insulating fibers in both the first and second sheet materials may be formed from a wide variety of materials, including natural fibers, such as cellulose, i.e., cotton; protein, i.e., wool and silk, and synthetic fibers. Suitable synthetic fibers include polyamides, polyesters, acrylics, polyolefins, nylon, rayon, acrylonitrile, and blends thereof. In general, the electrically insulating fibers will have bulk resistivities in the range from about $10^{11}$ to $10^{17}$ $\Omega$-cm, usually above about $10^{15}$ $\Omega$-cm.

The first and second sheet materials are woven by conventional techniques from the individual fibers. The size and spacing of the fibers in the first sheet material will depend on the size and spacing of the electrical conductors required in the elastomeric conductor being produced. Typically, the electrically-conductive fibers will have a diameter in the range from about $10^{-3}$ to $10^{-2}$ cm. The spacing between adjacent conductors typically in the range from about $5\times10^{-3}$ to $5\times10^{-2}$ cm. The spacing between the insulating fibers in the first sheet material is less critical, but are typically about the same as the spacing for the electrically conductive fibers. The fiber diameter of the electrically insulating fibers is selected to provide a sufficiently strong weave to withstand the subsequent processing steps. In all cases, the weave should be sufficiently loose so that gaps or interstices remain between adjacent fibers so that liquid elastomeric resin may be introduced to a stack of the woven sheets, as will be described hereinafter.

Figure 2:
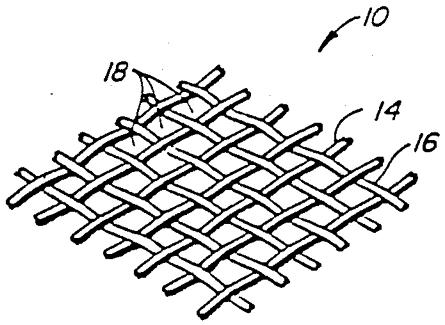
FIG. 2 is a detailed view of the first sheet material of the present invention.
Figure 3:
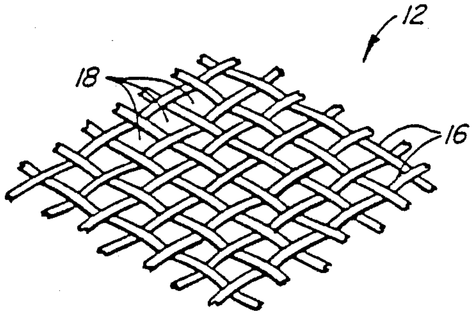
FIG. 3 is a detailed view of the second sheet material of the present invention.

Referring now to FIGS. 1-3, a plurality of first sheets 10 and second sheets 12 are be stacked in an alternating pattern. The dimensions of the sheets 10 and 12 are not critical, and will depend on the desired final dimensions of the elastomeric conductor product. Generally, the individual sheets 10 and 12 have a length L between about 1 and 100 cm, preferably more between about 10 and 50 cm. The width W of the sheets 10 and 12 is preferably between 1 and 100 cm, more usually between 10 and 50 cm. The sheets 10 and 12 are be stacked to a final height in the range from about 1 to 10 cm, preferably in the range from about 1 to 5 cm, corresponding to a total number of sheets in the range from about 25 to 500, generally from about 25 to 200 sheets.

The first sheets 10 are formed from electrically-conductive fibers 14 woven with electrically insulating fibers 16, as illustrated in detail in FIG. 2. The first sheets 10 are oriented so that the electrically-conductive fibers 14 in each of the sheets are parallel to one another. The second sheet material is comprised of a weave of electrically insulating fiber 16, as illustrated in FIG. 3. In both the first sheet material and the second sheet material, interstices 18 are formed between the individual fibers of the fabric. Depending on the size of the fibers 14 and 16, as well as on the spacing between the fibers, the dimensions of the interstices 18 may vary in the range from $10^{-3}$ to $10^{-2}$ cm.

In forming the stacks of the first and second sheet materials, the pattern illustrated in FIG. 1 may be varied within certain limits. For example, two or more of the second sheets 12 may be placed between adjacent first sheets 10 without departing from the concept of the present invention. In all cases, however, it will be necessary to have at least one of the second insulating sheets 12 between adjacent first conducting sheets 10. Additionally, it is not necessary that all of the first sheets 10 employed in a single stack be identical and two or more sheets 10 having different constructions may be employed. Similarly, it is not necessary that the second sheets 12 all be of identical construction, and a certain amount of variation is permitted.

In fabricating the materials of the present invention, it has been found convenient to employ commercially available sieve cloths which may be obtained from commercial suppliers. The second sheets may be nylon sieve cloths having a mesh ranging from about 80 to 325 mesh. The first sheet materials may be combined wire/-nylon mesh cloths having a similar mesh sizing.

After the stack has been formed, as illustrated in FIG. 1, it is necessary to mold the stack into a solid block of elastomeric material. This may be accomplished by introducing a curable elastomeric resin into the interstices 18 of the layered sheet materials 10 and 12. Suitable elastomeric resins include thermosetting resins, such as silicone rubbers, urethane rubbers, latex rubbers, and the like. Particularly preferred are silicone rubbers because of their stability over a wide temperature range, their low compression set, high electrical insulation, low dielectric constant, and durability.

Perfusion of the elastomeric resin into the layered first and second sheets may be accomplished by conventional methods, typically by conventional transfer molding techniques. The layered structure of FIG. 1 is placed in an enclosed mold, referred to as a transfer mold. Fluidized elastomeric resin is introduced to the transfer mold, under pressure so that the mold cavity is completely filled with the resin. Either a cold or a heated mold may be employed. In the case of a cold mold, it is necessary to later apply heat to cure the resin resulting in a solidified composite block of the resin and the layered sheet materials. Such curing will take on the order of one hour. The use of heated mold reduces the curing time to the order of minutes.

Figure 4:
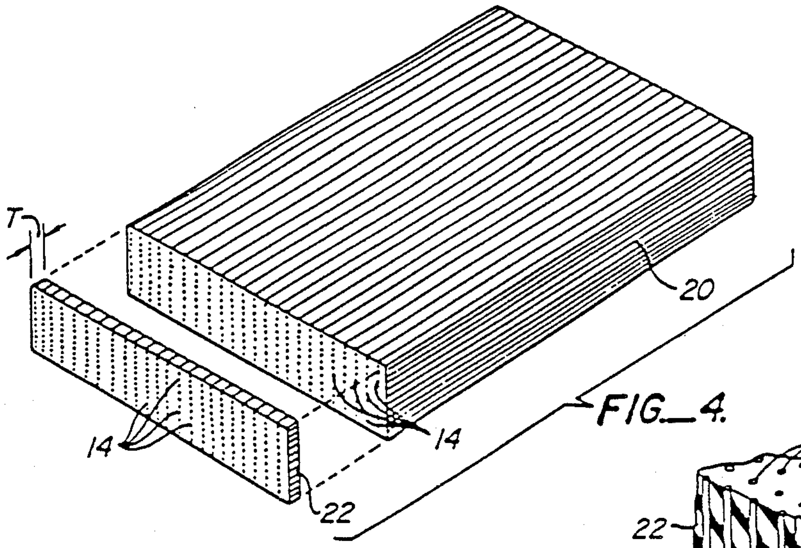
FIG. 4 illustrates the block of anisotropic elastomeric conductor material of the present invention having a single slice removed therefrom.

Referring now to FIG. 4, the result of the transfer molding process is a solidified block 20 of the layered composite material. As illustrated, the individual conductors 14 are aligned in the axial direction in the block 20. To obtain relatively thin elastomeric conductors preferred in most applications, individual slices 22 may be cut from the block 20 by slicing in a direction perpendicular to the direction in which the conductors are running. This results in a thin slice of material having individual conductors uniformly dispersed throughout and extending across the thickness T of the slice 22. As desired, the slice 22 may be further divided by cutting it into smaller pieces for particular applications. The thickness T is not critical, but usually will be in the range from about 0.02 to 0.4 cm.

The resulting thin section elastomeric conductor 22 will thus comprise a two-component matrix including both the insulating fiber material 16 and the elastomeric insulating material which was introduced by the transfer molding process. In some cases, it will be desirable to remove at least a portion of the insulating fiber material 16 in order to introduce voids in the conductor 22. Such voids enhance the compressibility of the conductor, which be beneficial under certain circumstances. The fibrous material may be dissolved by a variety of chemical means, typically employing oxidation reactions. The particular oxidation reaction will, of course, depend on the nature of the insulating fiber. In the case of nylon and most other fibers, exposure to a relatively strong mineral acid, such as hydrochloric acid, will generally suffice. After acid oxidation, the conductor material will of course be thoroughly washed before further preparation or use.

Figure 6:
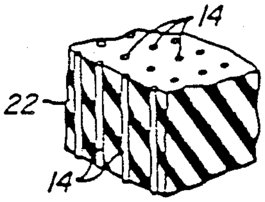
FIG. 6 is a detailed view, partially in cross section, of the new anisotropic elastomeric material.
Figure 5:
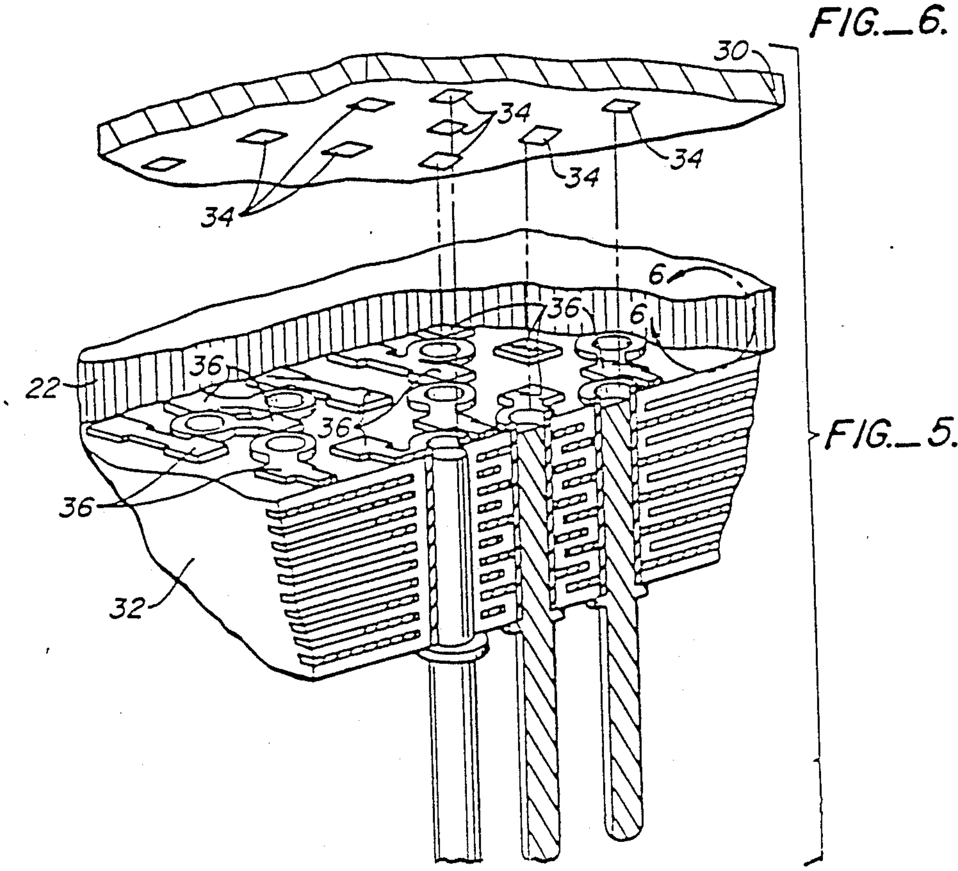
FIG. 5 illustrates the anisotropic elastomeric conductor material of the present invention as it would be used in forming an interface between an electronic device having a planar array of connector pads and a device support substrate having a mating array of connector pads

Referring now to FIGS. 5 and 6, an anisotropic elastomeric conductor material 22 of the present invention will find its greatest use in serving as an electrical interface between a semiconductor device 30 and a semiconductor support substrate 32. The semiconductor device 30 is of the type having a two-dimensional or planar array of electrical contact pads 34 on one face thereof. The support substrate 32, which is typically a multilayer connector board, is also characterized by a plurality of contact pads 36 arranged in a planar array. In general, the pattern in which the connector pads 34 are arranged on the semiconductor device 30 will correspond to that in which the contact pads 36 are arranged on the support substrate 32. The anisotropic elastomeric conductor 22 is placed between the device 30 and the substrate 32, and the device 30 and substrate 32 brought together in proper alignment so that corresponding pads 34 and 36 are arranged on directly opposite sides of the conductor 22. By applying a certain minimal contact pressure between the device 30 and substrate 32, firm electrical contact is made between the contact pads and the intermediate conductors 12. Usually, sufficient electrically-conductive fibers are provided in the conductor 22 so that at least two fibers and preferably more than two fibers are intermediate each of the pairs of contact pads 34 and 36.

In an alternate use, the elastomeric conductors of the present invention may be used to provide for thermal coupling between a heat-generating device, typically an electronic device, and a heat sink. When employed for such a use, the conductive fibers 12 will generally have a relatively large diameter, typically on the order of $10^{-2}$ cm. The elastomeric conductor of the present invention is particularly suitable for such applications since it will conform to both slight as well as more pronounced variations in the surface plurality of both the electronic device and the heat sink, thus assuring low thermal resistance between the two.

Although the foregoing invention has been described in some detail by way of illustration and example for purposes of clarity of understanding, it will be obvious that certain changes and modifications may be practiced within the scope of the appended claims.

What is claimed is:

1. An anisotropic elastomeric conductor, comprising a plurality of metal fibers in a matrix, wherein said metal conductors are oriented parallel to each other and said matrix includes both a fiber component and an elastomeric resin component, said anisotropic elastomeric conductor having peripheral dimensions in the range from 0.5 to 10 cm and a thickness in the range from 0.02 to 0.4 cm, wherein said thickness is defined by the direction of the metal fibers.

2. An anisotropic elastomeric conductor as in claim 1, wherein the metal fibers are arranged in a uniform pattern with an intermediate spacing in the range from 0.005 to 0.05 cm, and the metal fiber diameter is the range from 0.001 to 0.01 cm.

3. An anisotropic elastomeric conductor comprising:

a plurality of first and second sheets stacked together such that at least one second sheet separates adjacent first sheets, said first and second sheets are fabric woven from fibers so that interstitial gaps are formed between adjacent fibers;

said first sheets are fabric woven from electrically conductive fibers and electrically insulating fibers, the electrically conductive fibers running in one direction and the electrically insulating fibers running in the transverse direction;

said second sheets are fabric woven from electrically insulating fibers; and an elastomeric resin disposed between adjacent sheets and within said interstitial gaps.

4. The anisotropic elastomeric conductor of claim 3 wherein said electrically conductive fibers have a diameter in the range of 0.001 to 0.010 cm inclusive.

5. The anisotropic elastomeric conductor of claim 3 wherein said electrically conductive fibers are spaced apart from each other between 0.005 to 0.050 cm inclusive.

6. The anisotropic elastomeric conductor of claim 3 wherein said interstitial gaps between said fibers are between 0.001 to 0.010 cm.

7. The anisotropic elastomeric conductor of claim 3 wherein the arrangement of electrically conductive fibers on at least two adjacent first sheets varies between said adjacent first sheets.

8. The anisotropic elastomeric conductor of claim 3 wherein said elastomeric resin is a thermoplastic resin selected from the group consisting of silicone rubbers, urethane rubbers, and latex rubbers.

9. The anisotropic elastomeric conductor of claim 3 wherein voids are formed in said conductors.

10. The anisotropic elastomeric conductor of claim 6 wherein the arrangement of electrically conductive fibers on at least two adjacent first sheets varies between said adjacent first sheets.

11. The anisotropic elastomeric conductor of claim 6 wherein voids are formed in said conductors.

* * * * *